United States Patent [19]

Katanosaka

[11] Patent Number: 5,751,728
[45] Date of Patent: May 12, 1998

[54] SEMICONDUCTOR MEMORY IC TESTING DEVICE

[75] Inventor: Naoki Katanosaka, Tokyo, Japan

[73] Assignee: NEC Corporation, Tokyo, Japan

[21] Appl. No.: 837,953

[22] Filed: Apr. 28, 1997

Related U.S. Application Data

[63] Continuation of Ser. No. 517,661, Aug. 22, 1995, abandoned, which is a continuation of Ser. No. 974,520, Nov. 12, 1992, abandoned.

[30] Foreign Application Priority Data

Nov. 12, 1991 [JP] Japan ..................... 3-295321

[51] Int. Cl.[6] .................................................. G06F 11/00
[52] U.S. Cl. ............................................. 371/21.2; 371/27.1
[58] Field of Search .......................... 395/183.18, 183.07, 395/183.05, 183.1, 185.07; 371/21.1, 21.2, 21.3, 21.4, 21.5, 27.1, 27.5; 365/201

[56] References Cited

U.S. PATENT DOCUMENTS

| | | | |
|---|---|---|---|
| 4,464,750 | 8/1984 | Tatematsu | 371/21.2 |
| 4,541,090 | 9/1985 | Shiragasawa | 371/21.2 |
| 4,575,792 | 3/1986 | Keeley | 395/183.18 |
| 4,788,684 | 11/1988 | Kanaguchi et al. | 371/21.2 |
| 4,794,599 | 12/1988 | Purcell et al. | 371/21.2 |
| 4,821,238 | 4/1989 | Tatematsu | 371/21.1 |
| 4,873,705 | 10/1989 | Johnson | 371/21.2 |
| 4,912,395 | 3/1990 | Sato et al. | 371/21.2 |
| 5,050,169 | 9/1991 | Monett | 371/21.2 |
| 5,075,892 | 12/1991 | Choy | 371/21.2 |
| 5,088,022 | 2/1992 | Iwata | 395/183.07 |
| 5,157,664 | 10/1992 | Waite | 371/21.2 |
| 5,164,665 | 11/1992 | Yamashita et al. | 371/27 |
| 5,228,000 | 7/1993 | Yamagata | 371/21.1 |
| 5,267,206 | 11/1993 | Koyabu | 371/21.2 |
| 5,274,648 | 12/1993 | Eikill et al. | 371/21.2 |

OTHER PUBLICATIONS

Hur et al "Built–In Self Parallel Testing for Functional Faults in Megabit RAM's" IEEE Apr. 1991 pp. 3090–3093.
Mazumder et al "An Efficient Built–In Self Testing for Random Access Memory" IEEE 1989 pp. 246–253 (IEEE Trans. on Industrial Electronics vol. 36, No. 2 May 1989).

Primary Examiner—Joseph Palys
Attorney, Agent, or Firm—Sughrue, Mion, Zinn, Macpeak & Seas, PLLC

[57] ABSTRACT

In order to make it possible to simultaneously test 16 semiconductor memory ICs each having 16 I/O ports, a connecting part acting as an adapter is inserted between each of the semiconductor memory IC and a memory IC tester part. In testing a semiconductor memory IC, first, common write data for testing is simultaneously written to a large number of memory cells of the IC. For this purpose, write data from a write data generator in the memory IC tester port is written to the memory cells through an input and output change-over circuit, a write data branching circuit, and the I/O ports. Thereafter, data is read from the memory cells and supplied to an EX-OR circuit from the 16 I/O ports. The EX-OR output is supplied to an operational result data comparison and inspection unit of the memory IC tester part via the input and output change-over circuit. The value of the EX-OR output goes to a high level only when all of the read data from the 16 I/O ports are equal, and goes to a low level otherwise. Accordingly, the low level of the EX-OR output indicates that there exists an abnormality in either of writing or reading in the memory cells that generated these read data.

4 Claims, 4 Drawing Sheets

SEMICONDUCTOR MEMORY IC TESTING DEVICE

This is a Continuation of application Ser. No. 08/517,661 filed Aug. 22, 1995, now abandoned which is a continuation of U.S. application Ser. No. 07/974,520, filed Nov. 12, 1992, now abandoned.

BACKGROUND OF THE INFORMATION

1. Field of the Invention

The present invention relates to a semiconductor memory IC device, and more particularly to a semiconductor memory IC testing device for testing the quality of a semiconductor memory IC having a plurality of input and output (I/O) ports.

2. Description of the Prior Art

The conventional semiconductor memory IC testing device consists of 16 write data generator which supplies 16 test data to the memory cells in a semiconductor memory IC via the 16 I/O ports, and a memory IC tester part having 16 operational result data comparison and inspection unit which receive the supply of 16 read data from the memory cells that respectively receive the writing of these test data. In this conventional example, the number of memory ICs that can be tested at one time is four for semiconductor memory IC that has four I/O ports, and one for semiconductor memory IC that has 16 I/O ports.

Accordingly, the conventional memory IC testing device in the above has a problem that the test of the semiconductor memory ICs having 16 I/O ports cannot be performed efficiently.

BRIEF SUMMARY OF THE INVENTION

Object of the Invention

It is the object of this invention to provided a semiconductor memory IC testing device which can perform the test of semiconductor memory ICs having a plurality of I/O ports with high efficiency.

SUMMARY OF THE INVENTION

In order to make it possible to simultaneously test a plurality of semiconductor memory ICs each having a plurality of I/O ports, the testing device according to this invention is constructed such that a connecting part that acts as an adapter is inserted between the memory IC tester part and each of the semiconductor memory ICs.

One of the plurality of the connecting parts includes a first input and output change-over circuit <4> which receives a single first write data <ST> for testing at a first input and output change-over terminal <C> to output the data from a first write fixing terminal <W>, and receives a first EX-OR output data <SE> at a read fixing terminal <R> to output the data from the first input and output change-over terminal, a first write data branching circuit <2> which branches the first write data from the first write fixing terminal to supply the data to the plural I/O ports of a first semiconductor memory IC, and writes the data to memory cells that correspond to the I/O ports, and first logical operation circuits <3A and 3B> which output a first EX-OR output data obtained by subjecting a first read data <st> group read from these memory cells and taken out from the plurality of I/O ports of the first semiconductor memory IC to the EX-OR operation.

Another of the connecting parts has a second input and output circuit <4> which receives a single second write data <ST> at a second input and output change-over terminal <C> to output the data from a second write fixing terminal <W>, and receives a second EX-OR output data <SE> at a read fixing terminal <R> to output the data from the second input and output change-over terminal, a second write data branching circuit <2> which branches the second write data from the second write fixing terminal to supply the data to a plurality of I/O ports of a second semi-conductor memory IC, and second logical operation circuits <3A and 3B> which output a second EX-OR output data obtained by subjecting a second read data <st> group read from these memory cells and taken out from the plurality of I/O ports of the second semiconductor memory IC to the EX-OR operation.

A first memory IC tester part <5> has a first write data generator <51> which supplies the first write data <ST> to the first input and output change-over terminal via a first input and output node <N>, a first operational result data comparison and inspection unit <52> which compares the first EX-OR output data received from the first input and output change-over terminal with a first reference comparison data, a second write data generator which supplies the second write data to the second input and output change-over terminal via the second input and output node, and a second operational result data comparison and inspection unit which compares the second EX-OR output data received from the second input and output change-over terminal with a second reference comparison data.

The memory IC testing device according to this invention judges whether all of the data simultaneously read from the plurality of I/O ports of the semiconductor memory IC are equal, so it is possible to simultaneously test a large number of semiconductor ICs each of which having a large number of I/O ports, and hence has an effect of enhancing the testing efficiency.

DETAILED DESCRIPTION OF THE INVENTION

In order to make it possible to simultaneously test 16 semiconductor memory ICs each of which having 16 I/O ports, an embodiment of this invention has a construction in which a connecting part that acts as an adapter is inserted between each of the semiconductor memory IC and a memory IC tester part.

The semiconductor memory IC testing device according to the invention consists of one memory IC tester part and 16 connecting parts. The memory IC tester part consists of 16 sets of the combination of a write data generator and a data comparison and inspection unit in which one set is formed by a write data generator which supplies a write data for testing to an input and output node and an operational result data comparison and inspection unit which compares an output data received from the EX-OR circuit in response to the agreement state of the read data from the plurality of memory cells to which is written the write data, and received from the input and output node, with a reference comparison data.

The connecting part in the first embodiment of the invention includes an input and output change-over circuit which receives a write data at the input and output change-over terminal through the input and output node and outputs it from the write fixing terminal, a write data branching circuit which supplies, by branching, the write data received from the write fixing terminal to the 16 I/O ports of the semiconductor memory IC and writes the branched data to the memory cells that correspond to these I/O ports, and an EX-OR circuit which subjects the data read from the plurality of memory cells via the I/O ports to the EX-OR operation and outputs the EX-OR output data which is the result of the operation to the read fixing terminal of the input and output change-over circuit.

The connecting part in the second embodiment of the invention includes an input and output change-over circuit which receives a write data at the input and output change-over terminal through the input and output node and outputs it from the write fixing terminal, a write data branching circuit which supplies, by branching, the write data received from the write fixing terminal to the 16 I/O ports of the semiconductor memory IC and writes the branched data to the memory cells that correspond to these I/O ports, and a logical operation circuit which subjects the data read from the plurality of memory cells via the I/O ports to a logical operation and outputs the resulting output data to the read fixing terminal of the input and output change-over circuit. The logical operation circuit in this embodiment has an EX-NOR circuit and a two state output circuit which receives an EX-NOR output data and a read data from one of the I/O ports and switches between either one of the two states in which an EX-NOR output data is output or the result is brought to a high impedance state.

Figure 1:
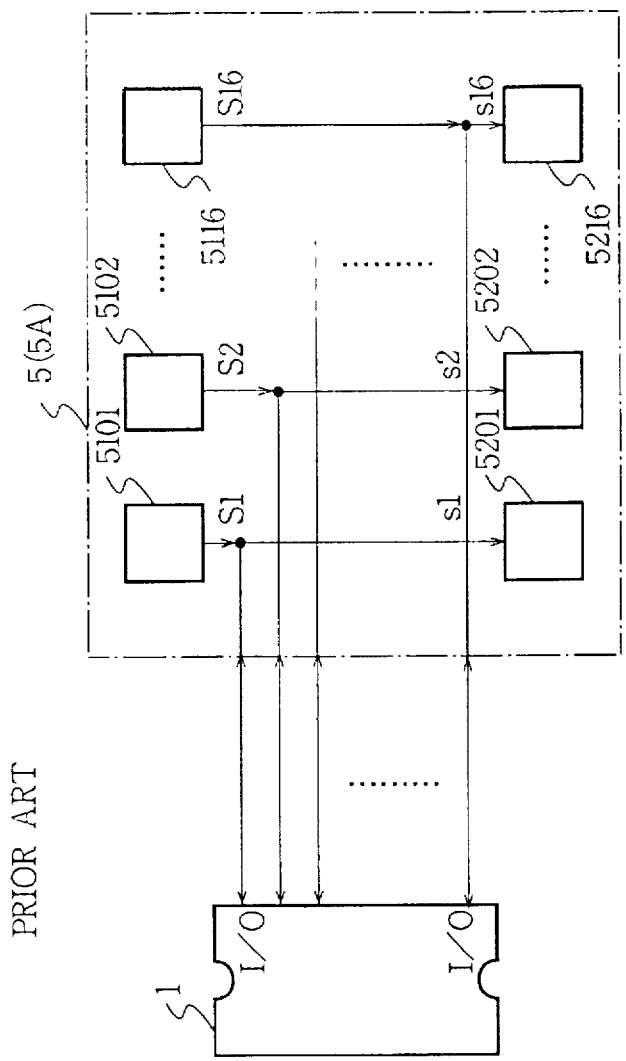
FIG. 1 is a block diagram showing the construction of the prior art.

Referring to FIG. 1, the memory IC tester part 5 has 16 write data generators 5101–5116 which supply test data S1–S16 respectively to the internal memory cells of the semiconductor memory IC 1 via 16 I/O ports, and 16 operational result data comparison and inspection units 5201–5216 which receive read data S1–S16 from the memory cells to which are written the test data. The number of memory ICs that can be tested simultaneously by the IC tester part 5 equals four for ICs having four I/O ports, and one for ICs having 16 I/O ports.

Figure 2:
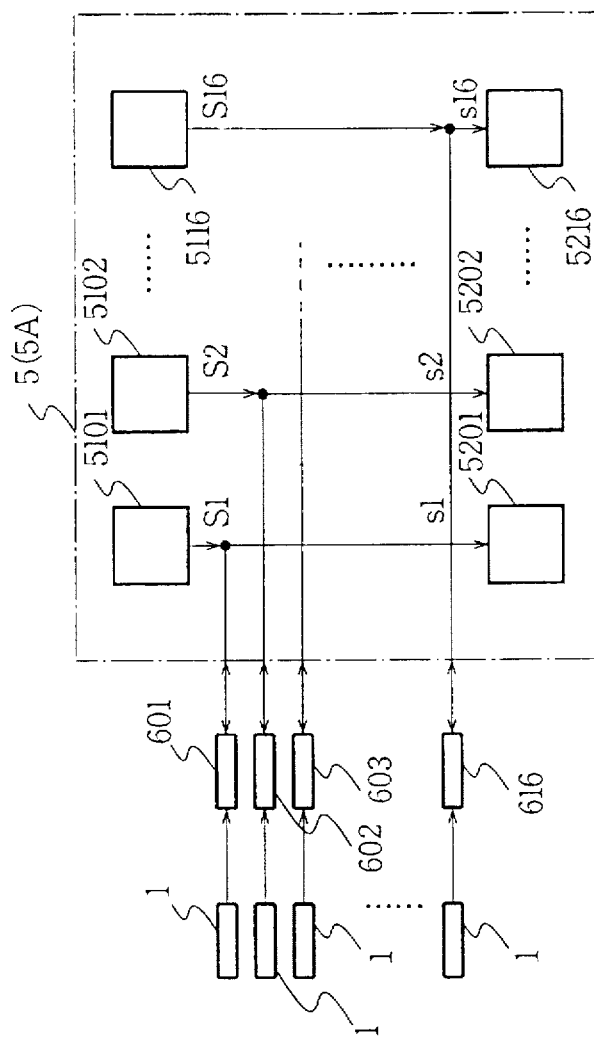
FIG. 2 is a block diagram showing the construction of an embodiment of this invention.

Referring to FIG. 2, in order to make it possible to simultaneously test 16 semiconductor memory ICs 1, each having 16 I/O ports, the embodiment of this invention contrives to insert connecting parts 601–616 acting as adapters between the respective semiconductor memory ICs 1 and the memory IC tester part 5.

Figure 3:
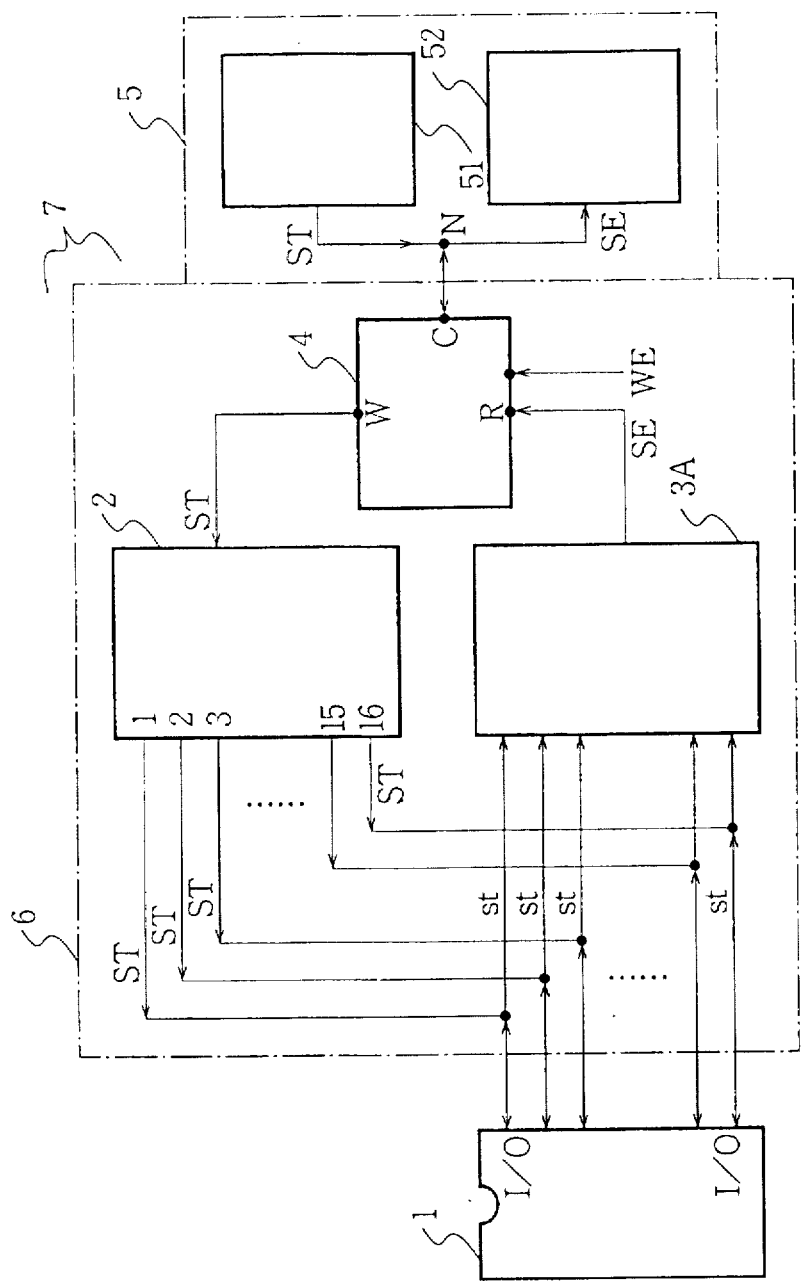
FIG. 3 is a block diagram showing a first embodiment of this invention.

FIG. 3 shows one of the semiconductor memory ICs in FIG. 2, one of the connecting parts connected to the semiconductor memory IC, and one each of the write data generator and the operational result data comparison and inspection unit that are connected to the connecting part, by assigning to them representative symbols 1, 6, 51, and 52, respectively. The semiconductor memory IC testing device 7 consists of the memory IC tester part 5 and the connecting part 6. The memory IC tester part 5 has the write data generator 51 which supplies a write data ST for testing to the input and output node N, and the operational result data comparison and inspection unit 52 which compares the output data SE that is output from the EX-OR circuit 3A in response to the agreement state of the read data st from the plurality of memory cells to which is written the write data ST, by receiving the data SE from the input and output node N, with a reference comparison data to detect the logic level of the data SE indicating whether there occurred an abnormality in the memory IC 1.

The connecting part 6 has an input and output circuit 4 which receives the write data ST from the input and output node via the input and output change-over terminal C and outputs it from the write fixing terminal W to a write data branching circuit 2 which supplies, by branching, the write data ST to 16 I/O ports of the semiconductor memory IC 1 and writes the data to the respective corresponding memory cells, and the EX-OR circuit 3A which receives the read data st from these memory cells via the I/O ports and outputs the EX-OR output SE of these read data to the read fixing terminal R of the input and output change-over circuit 4.

For testing the memory characteristics of the semiconductor memory IC 1, first, the write data ST is written to the memory cells of the semiconductor memory IC 1. For this purpose, the input and output change-over terminal C of the input and output change-over circuit 4 is put in advance in the state of being connected to the write fixing terminal W in response to a write enable pulse WE coming from the outside. Accordingly, the write data ST is supplied to the write data branching circuit 2 via the input and output change-over terminal C and the write fixing terminal W of the input and output change-over circuit 4. The data ST is branched in the write data branching circuit 2, supplied to the 16 I/O ports of the semiconductor memory IC 1 through 16 data lines, and written to the respective memory cells that correspond to the I/O ports.

Next, by carrying out data read from these memory cells the read data st from the 16 I/O ports are supplied to the connecting part 6. In this stage of reading, the input and output change-over terminal C of the input and output change-over circuit 4 is in the state of being connected to the read fixing terminal R in response to the write enable pulse WE. The read data st is supplied to the EX-OR circuit 3A, and the output SE of the circuit 3A is supplied to the operational result data comparison and inspection unit 52 of the memory IC tester part 5 via the read fixing terminal R and the input and output change-over terminal C of the input and output change-over circuit 4. The output SE of the EX-OR circuit 3A goes to a high level only when all of the 16 read data st are equal, and goes to a low level otherwise. In other words, that the output SE is in the low level shows the presence of either writing or reading abnormality in the memory cells that generated these read data. Accordingly, this embodiment makes it possible to determine whether a fault occurred in either the writing or the reading of the semiconductor memory IC 1.

Figure 4:
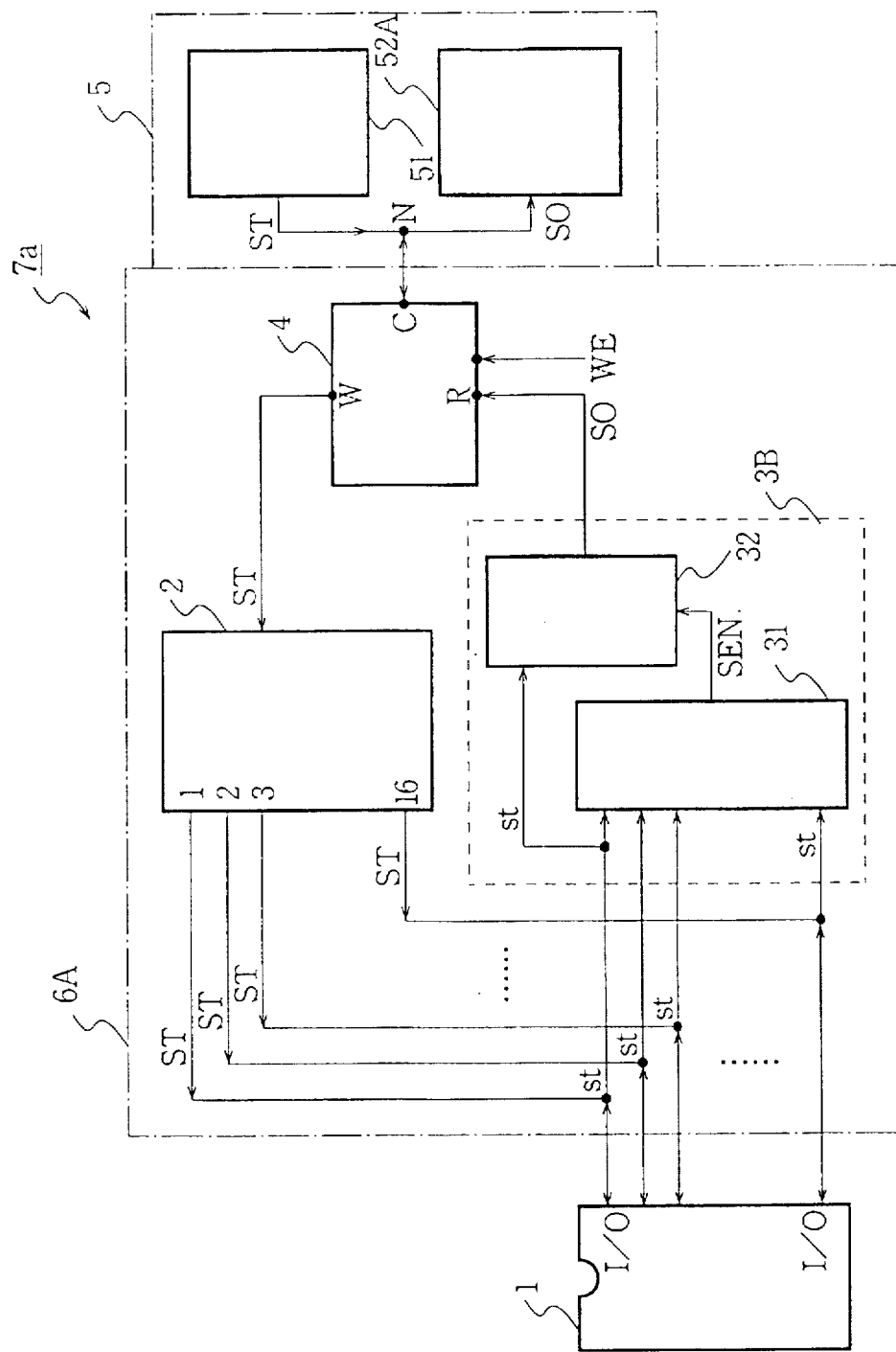
FIG. 4 is a block diagram showing a second embodiment of this invention.

FIG. 4 shows one of the semiconductor memory IC in the embodiment in FIG. 2, one connecting part that is connected to the IC, and one each of the write data generator and the operational result data comparison and inspection unit that are connected to the connecting part, by assigning to them representative symbols 1, 6A, 51, and 52A, respectively. This semiconductor memory IC testing device 7a consists of a connecting part 6A and a memory IC tester part 5A. The memory IC tester part 5A has a write data generator 51 which supplies a write data ST for testing to the input and output node N, and an operational result data comparison and inspection unit 52A which receives from the input and output node N an output data SO output from a logical operation circuit 3B in response to the presence of mutual agreement among the read data st from the memory cells to which is written the write data ST for testing, and compares the data SO with a reference data. The connecting part 6A has an input and output change-over circuit 4 which receives the write data ST from the input and output node N to the input and output change-over terminal C and outputs it from the write fixing terminal W, a write data branching circuit 2 which supplies, by branching, the write data ST received at the write fixing terminal W to the 16 I/O ports, and writes the data to the memory cells that correspond to these I/O ports, and a logical operation circuit 3B which receives the read data st from these memory cells via the I/O ports to subject the data st to the logical operation, and outputs the operational output data SO to the read fixing terminal R of the input and output change-over circuit 4. The logical operation circuit 3B has an EX-NOR circuit 31, and a two state output circuit 32 which receives the input of an output data SEN from the circuit 31 and a read data st from one of the I/O ports, and switches between the states of either outputting the data SEN as an output data SO or keeping the output side at high impedance.

In the test of the semiconductor memory IC 1 by this testing device, first, the same write data ST for testing is written to the memory cells of the semiconductor memory IC 1 similarly to the case in FIG. 3. The read data st from the 16 I/O ports of the IC 1 are supplied to the EX-NOR circuit 31 and its output data SEN is supplied to the two state output circuit 32 together with one of the read data st. If the data SEN is at a high level, it shows the presence of an abnormal state in IC 1, and the output data SO shows a high impedance state on the output side of the two state output circuit 32. On the other hand, low level of the data SEN shows the normal state of the semiconductor memory IC 1 and the write data ST is output as the output data SO. The output data SO is supplied to the operational result data comparison and inspection unit 52A of the tester part 5 via the read fixing terminal R and the input and output change-over terminal C of the input and output change-over circuit 4.

When the output data SO shows a high impedance state on the output side of the circuit 32, it is possible to discriminate the high or low level of the read data st in abnormal state by the generation within the tester part 5A of an intermediate potential that cannot be judged to be either one of high or low level. Therefore, it is possible to display the failure state of the IC in more detail than by the embodiment in FIG. 3.

The memory IC testing device according to this invention judges the presence of mutual agreement of the read data from a plurality of I/O ports of the semiconductor memory IC of the object of the test. Accordingly, it is possible to test simultaneously a large number of semi-conductor memory ICs each having a large number of I/O ports, and enhance the efficiency of the test.

I claim:

1. An adapter for coupling a memory testing device and at least one semiconductor memory IC for testing said semiconductor memory IC, said semiconductor memory IC having a plurality of input/output pins through which a plurality of write data and a plurality of read data are transferred, wherein said adapter is external to said semiconductor memory IC and comprises:

an input/output terminal coupled to said memory testing device;

a plurality of test terminals coupled respectively to said input/output pins of said at least one semiconductor memory IC;

a branching circuit having a first input node supplied operatively with a test data and a plurality of output nodes coupled respectively to said test terminals, said branching circuit responding to said test data and outputting a plurality of first data respectively at said first output nodes in parallel to each other, said plurality of first data being thereby written into said at least one semiconductor memory IC through respective ones of said input/output pins as said plurality of write data;

a logical operation circuit having a second output node and a plurality of second input nodes coupled respectively to said test terminals to receive a plurality of second data which are read out from said at least one semiconductor memory IC and appear respectively at said input/output pins in parallel to each other as said plurality of read data, said logical operation circuit performing a logical operation on said plurality of second data and outputting an output data indicative of a result of said logical operation at said second output node; and a changeover circuit having a write node, a read node and an input/output node, said write node being connected to said first input node of said branch circuit, said read node being connected to said second output node of said logical operation circuit, said input/output node being connected to said input/output terminal, said changeover circuit receiving at said write node a third data from said memory testing device through said input/output terminal to transfer said third data to said first input node of said branching circuit as said test data and receiving at said read node said output data from said logical operation circuit through said second output node to transfer said output data to said input/output terminal through said input/output node.

2. An adapter as claimed in claim 1, wherein said logical operation is an EX-OR operation in which said second data are EX-ORed.

3. A system for parallel testing of several semiconductor memory IC's, each having a plurality of connection pins, said system comprising a memory testing device and a plurality of adapters, each of said adapters provided for one of said semiconductor memory IC's;

wherein said memory testing device comprises:
a plurality of input/output terminals;
a plurality of write data generators, each connected to a respective one of said input/output terminals;
a plurality of inspection units, each connected to a respective one of said input/output terminals;
and wherein each of said adapters comprises:
a change-over terminal connected to one of said input/output terminals of said memory testing device;
a plurality of branching terminals, each connected to one of said plurality of connection pins of one of said semiconductor memory IC's;
a change-over circuit connected to said change-over terminal and having a write terminal and a read terminal, said change-over circuit responsive to an enabling signal to transfer a test data from the change-over terminal to the write terminal and to transfer signals appearing on the read terminal to the change-over terminal;
a write data branching circuit for receiving the test data from the change-over circuit and branching the test data into said plurality of branching terminals;

a logical unit responsive to read signals on said plurality of branching terminals to perform a logical test on said plurality of read signals and output a read-test signal to indicate whether an error occurred in writing the test data into, and reading the read data out of, said one of the plurality of semiconductor memory IC's.

4. The system of claim 3, wherein said adapter further comprises a two-state output circuit interposed between said logical unit and change-over circuit, said two-state circuit receiving the read-test signal from said logical unit and at least one of said read signals, wherein when said read-test signal indicates no error, said two-state output circuit transfers said one of said read signals to said read terminal of said change-over circuit, and otherwise presents high impedance to said read terminal of said change-over circuit.

* * * * *